(12) United States Patent
Iadonato et al.

(10) Patent No.: US 7,555,738 B2
(45) Date of Patent: *Jun. 30, 2009

(54) INTEGRATED STRUCTURE LAYOUT AND LAYOUT OF INTERCONNECTIONS FOR AN INSTRUCTION EXECUTION UNIT OF AN INTEGRATED CIRCUIT CHIP

(75) Inventors: Kevin Ray Iadonato, San Jose, CA (US); Le Trong Nguyen, Monte Sereno, CA (US)

(73) Assignee: Seiko Epson Corporation, Tokyo (JP)

( * ) Notice: Subject to any disclaimer, the term of this patent is extended or adjusted under 35 U.S.C. 154(b) by 220 days.

This patent is subject to a terminal disclaimer.

(21) Appl. No.: 11/651,467

(22) Filed: Jan. 10, 2007

(65) Prior Publication Data

US 2007/0113214 A1    May 17, 2007

Related U.S. Application Data

(63) Continuation of application No. 10/885,871, filed on Jul. 8, 2004, now Pat. No. 7,174,525, which is a continuation of application No. 10/139,318, filed on May 7, 2002, now Pat. No. 6,782,521, which is a continuation of application No. 09/604,419, filed on Jun. 27, 2000, now Pat. No. 6,401,232, which is a continuation of application No. 09/173,560, filed on Oct. 16, 1998, now Pat. No. 6,083,274, which is a continuation of application No. 08/980,057, filed on Nov. 26, 1997, now Pat. No. 5,831,871, which is a continuation of application No. 08/730,658, filed on Oct. 11, 1996, now Pat. No. 5,734,584, which is a continuation of application No. 08/353,299, filed on Dec. 5, 1994, now Pat. No. 5,566,385, which is a continuation-in-part of application No. 07/860,718, filed on Mar. 31, 1992, now Pat. No. 5,371,684.

(51) Int. Cl.
*G06F 17/50* (2006.01)
*G06F 7/00* (2006.01)
*G06F 15/76* (2006.01)
*G06F 9/30* (2006.01)
*G06F 9/40* (2006.01)

(52) U.S. Cl. .................... 716/10; 716/14; 716/17; 716/7; 326/47; 326/101; 712/26; 712/201

(58) Field of Classification Search .................. 716/10, 716/14, 17, 7; 326/47, 101; 327/565; 712/26, 712/201
See application file for complete search history.

(56) References Cited

U.S. PATENT DOCUMENTS 3,913,074 A    10/1975  Homberg et al.
(Continued)

FOREIGN PATENT DOCUMENTS

EP         415497 A2    3/1991
(Continued)

OTHER PUBLICATIONS

Luk et al., "Multistack Optimization for Data-Path Chip Layout," *IEEE Transaction on Computer-Aided Design of Integrated Circuits and Systems*, vol. 10, No. 1, Jan. 1991.
(Continued)

*Primary Examiner*—Phallaka Kik
(74) *Attorney, Agent, or Firm*—Sterne, Kessler, Goldstein & Fox PLLC

(57) ABSTRACT

An integrated structure layout of functional blocks and interconnections for an integrated circuit chip. Data dependency comparator blocks are arranged in rows and columns. This arrangement defines layout regions between adjacent ones of the data dependency comparator blocks in the rows. Tag assignment logic blocks are coupled to the data dependency comparator blocks to receive dependency information. The tag assignment logic blocks are positioned in one or more of the layout regions so as to be integrated with the data dependency comparator blocks to conserve area on the semiconductor chip and to spatially define a channel in and substantially orthogonal to one or more of the rows. Register file port multiplexer blocks are coupled to output lines of the tag assignment logic block adjacent to the orthogonal channel to receive tag information and to pass the tag information to address ports of a register file.

9 Claims, 4 Drawing Sheets

U.S. PATENT DOCUMENTS

| | | |
|---|---|---|
| 4,498,134 A | 2/1985 | Hansen et al. |
| 4,500,963 A | 2/1985 | Smith et al. |
| 4,532,598 A | 7/1985 | Shibayama et al. |
| 4,613,941 A | 9/1986 | Smith et al. |
| 4,791,607 A | 12/1988 | Igarashi et al. |
| 4,814,978 A | 3/1989 | Dennis |
| 4,945,479 A | 7/1990 | Rusterholz et al. |
| 4,964,057 A | 10/1990 | Yabe |
| 4,964,479 A | 10/1990 | Yabe |
| 5,150,309 A | 9/1992 | Shaw et al. |
| 5,150,509 A | 9/1992 | Shaw et al. |
| 5,276,899 A | 1/1994 | Neches |
| 5,371,684 A | 12/1994 | Iadonato et al. |
| 5,497,499 A | 3/1996 | Garg et al. |
| 5,539,911 A | 7/1996 | Nguyen et al. |
| 5,560,032 A | 9/1996 | Nguyen et al. |
| 5,560,035 A | 9/1996 | Garg et al. |
| 5,566,385 A | 10/1996 | Iadonato et al. |
| 5,615,126 A | 3/1997 | Deeley et al. |
| 5,734,584 A | 3/1998 | Iadonato et al. |
| 5,826,055 A | 10/1998 | Wang et al. |
| 5,826,065 A | 10/1998 | Wang et al. |
| 5,831,871 A | 11/1998 | Iadonato et al. |
| 6,083,274 A | 7/2000 | Iadonato et al. |
| 6,093,274 A | 7/2000 | Iadonato et al. |
| 6,401,232 B1 | 6/2002 | Iadonato et al. |
| 6,782,521 B2 | 8/2004 | Iadonato et al. |
| 7,174,525 B2 * | 2/2007 | Iadonato et al. ............... 716/10 |
| 2002/0129324 A1 | 9/2002 | Iadonato et al. |

FOREIGN PATENT DOCUMENTS

| | | |
|---|---|---|
| EP | A0 437044 | 7/1991 |
| JP | 62175831 A | 8/1987 |
| JP | 1-231126 | 9/1989 |
| JP | 2-48732 | 2/1990 |
| JP | 3-196334 | 8/1991 |
| JP | 4-405519 | 2/1992 |
| JP | 4-80824 | 3/1992 |
| JP | H6 501124 | 2/1994 |
| WO | 93/01546 | 1/1993 |

OTHER PUBLICATIONS

Mike Johnson, Superscalar Microprocessor Design, Prentice-Hall, Inc., Englewood Cliffs, New Jersey, 1991.

John L. Hennesey et al., Computer-Architecture—A Quantitative Approach, Morgan Kaufmann Publishing, Inc., San Mateo, California, 1990.

Japanese Notification of Reasons for Refusal, for Japanese Patent Appl. No. H5-517295, dated Sep. 24, 23003, with translation, 4 pages.

NN620564, "Logical Circuits And Memory", IBM Technical Disclosure Bulletin, vol. 4, No. 12, May 1962, pp. 64-66 (6 pages).

* cited by examiner

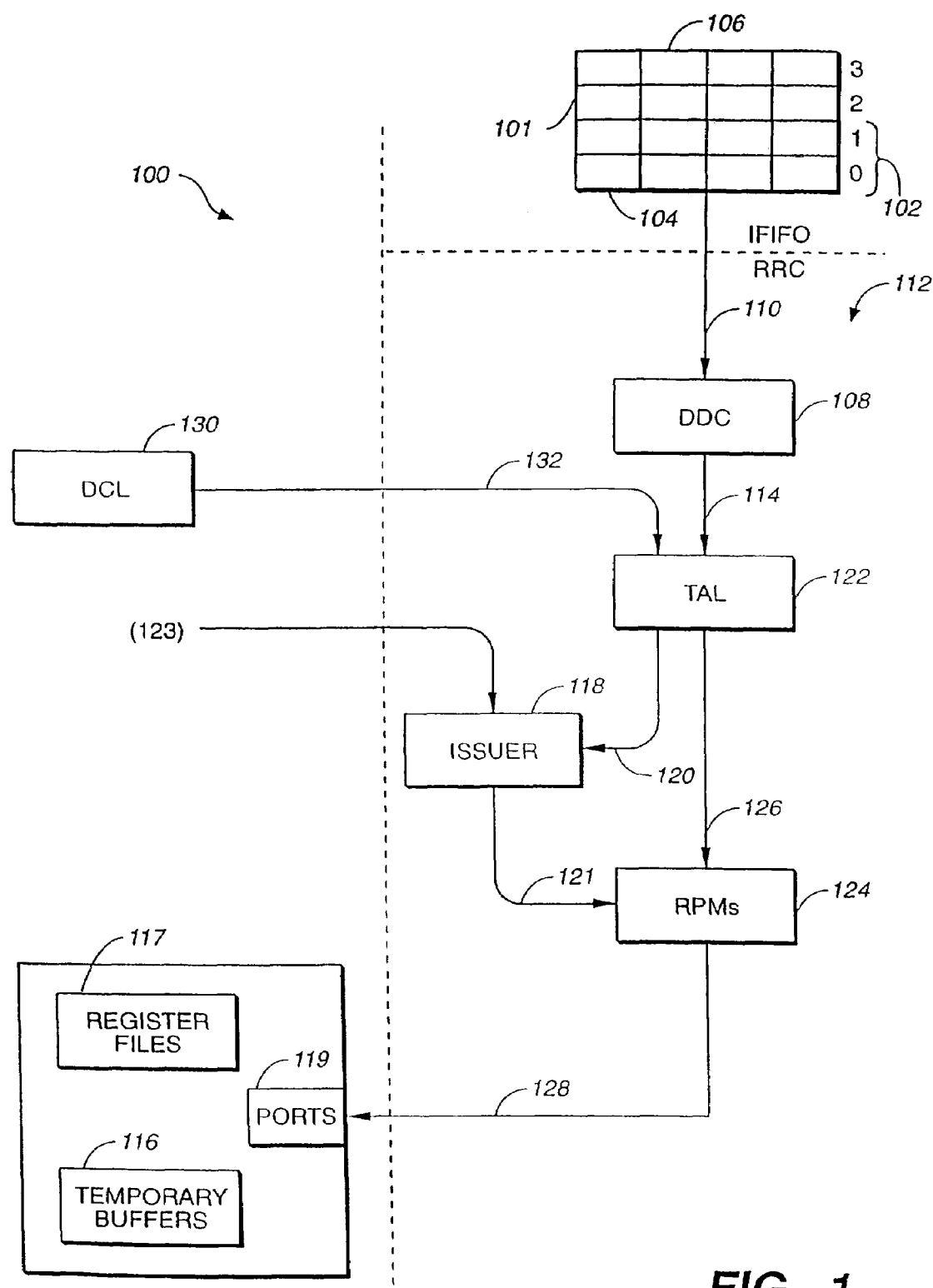
FIG._1

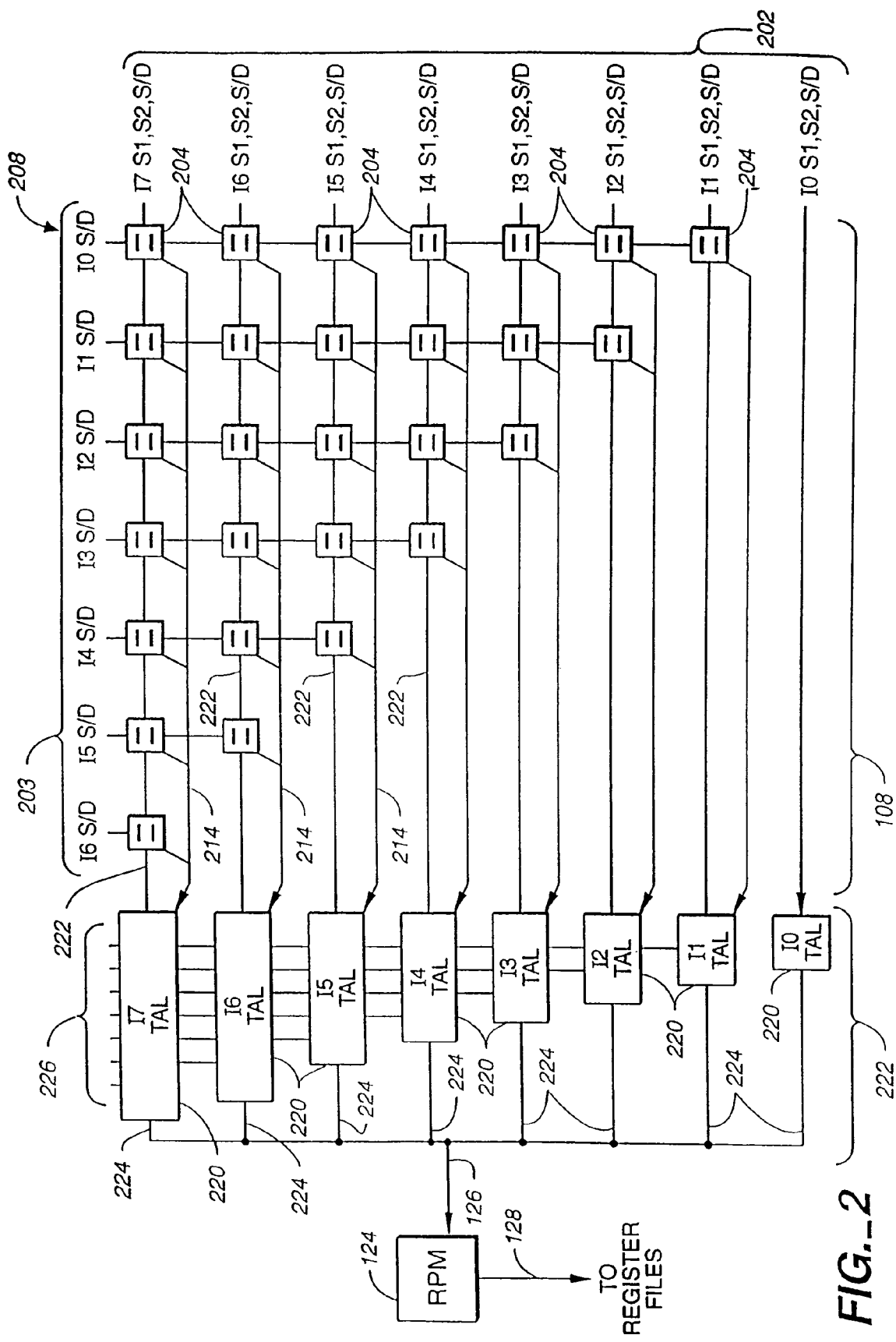
FIG._2

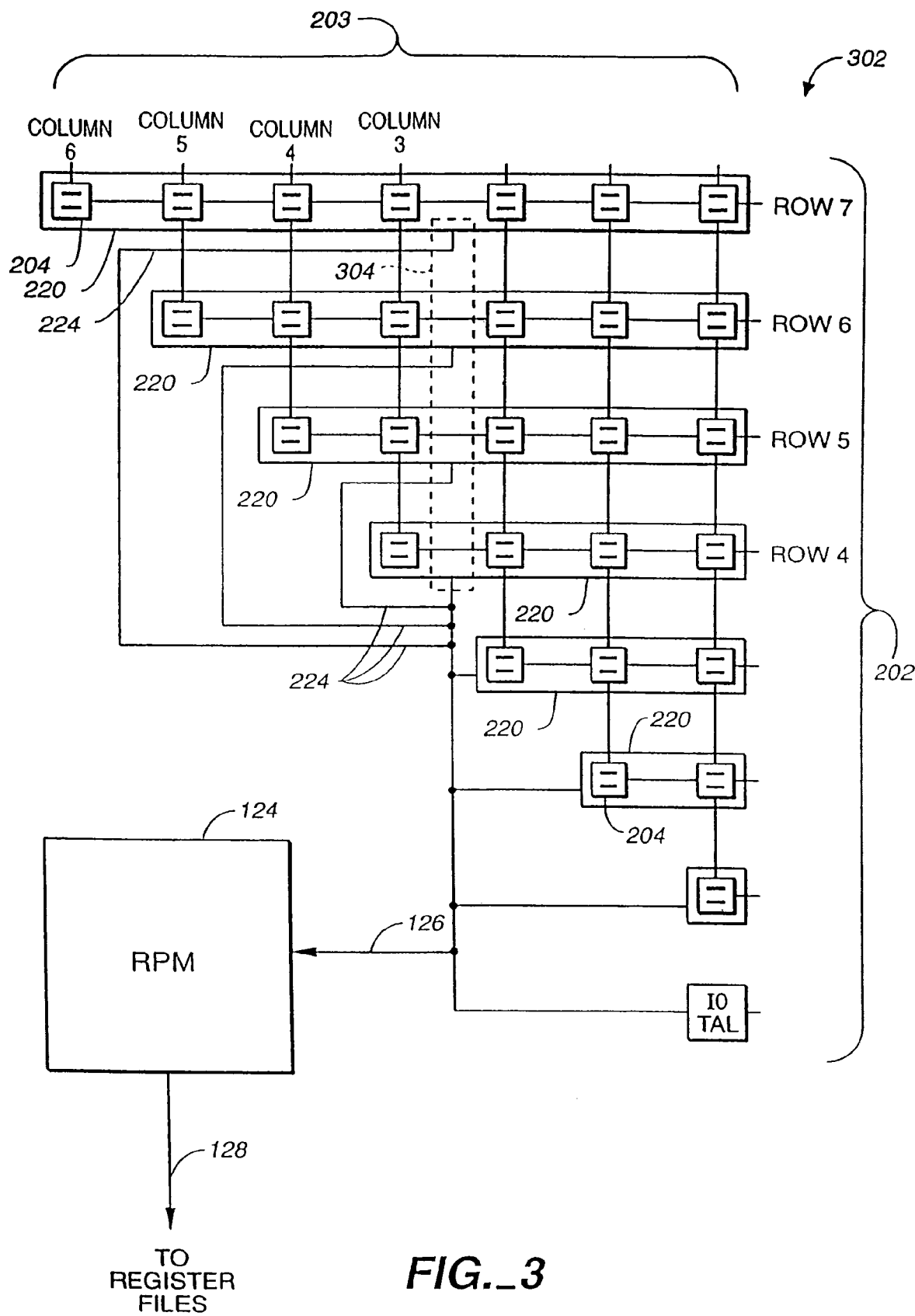
FIG._3

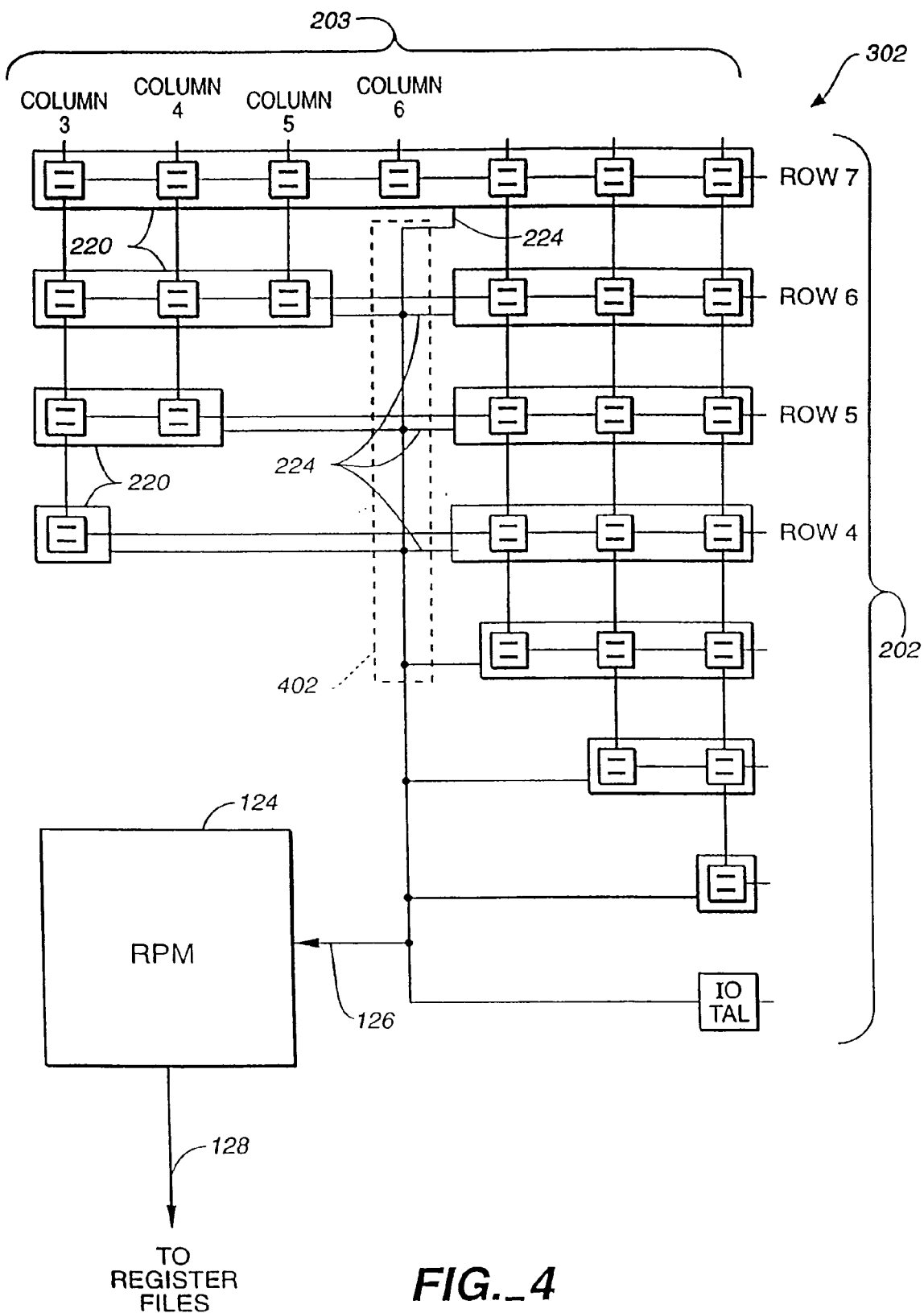
FIG._4

INTEGRATED STRUCTURE LAYOUT AND LAYOUT OF INTERCONNECTIONS FOR AN INSTRUCTION EXECUTION UNIT OF AN INTEGRATED CIRCUIT CHIP

CROSS-REFERENCE TO RELATED APPLICATIONS

The present application is a continuation of application Ser. No. 10/885,871, filed Jul. 8, 2004, now U.S. Pat. No. 7,174, 525, which is a continuation of application Ser. No. 10/139, 318, filed May 7, 2002, now U.S. Pat. No. 6,782,521, which is a continuation of application Ser. No. 09/604,419, filed Jun. 27, 2000, now U.S. Pat. No. 6,401,232, which is a continuation of 09/173,560, filed Oct. 16, 1998, now U.S. Pat. No. 6,083,274, which is a continuation of application Ser. No. 08/980,057, filed Nov. 26, 1997, now U.S. Pat. No. 5,831, 871, which is a continuation of application Ser. No. 08/730, 658, filed Oct. 11, 1996, now U.S. Pat. No. 5,734,584, which is a continuation of application Ser. No. 08/353,299, filed Dec. 5, 1994, now U.S. Pat. No. 5,566,385, which is a continuation-in-part of application Ser. No. 07/860,718, filed Mar. 31, 1992, now U.S. Pat. No. 5,371,684.

The following are related patents:

"Superscalar RISC Instruction Scheduling," U.S. Pat. No. 5,497,499;

"High Performance, Superscalar-Based Computer System with Out-of-Order Instruction Execution," U.S. Pat. No. 5,539,911; and "High Performance, Superscalar-Based Computer System with Out-of-Order Instruction Execution," U.S. Pat. No. 5,560,032.

The disclosures of the above patents are incorporated herein by reference.

BACKGROUND OF THE INVENTION

1. Field of the Invention

The present invention relates to an arrangement of components fabricated in a semiconductor material with significant design emphasis on the topological arrangement of the components and their interconnections.

2. Related Art

The arrangement of components (e.g., functional blocks) and their interconnections fabricated in a semiconductor material (e.g., on a microprocessor integrated circuit chip) becomes more complicated as the functionality on the chip grows due to the increasing number of transistors integrated on the chip.

Take, for example, the complexity of data dependency checking in the execution unit of a RISC (reduced instruction set computer) microprocessor. Given instructions with two input operands and one output value, as holds for typical RISC instructions, then there are five possible dependencies between any two instructions: two true dependencies, two anti-dependencies, and one output dependency.

Furthermore, the number of dependencies between a group of instructions (such as a group of instructions in a window) varies with the square of the number of instructions in the group, because each instruction must be considered against every other instruction. Complexity is further multiplied by the number of instructions that the processor attempts to decode, issue, and complete in a single cycle, because these actions introduce dependencies, are controlled by dependencies, and remove dependencies from consideration.

True dependencies (sometimes called "flow dependencies" or "write-read" dependencies) are often grouped with anti-dependencies (also called "read-write" dependencies) and output dependencies (also called "write-write" dependencies) into a single group of instruction dependencies. The reason for this grouping is that each of these dependencies manifests itself through the use of registers or other storage locations. However, it is important to distinguish true dependencies from the other two. True dependencies represent the flow of data and information through a program. Anti- and output dependencies arise because, at different points in time, registers or other storage locations hold different values for different computations.

When instructions are issued in order and complete in order, there is a one-to-one correspondence between registers and values. At any given point in execution, a register identifier precisely identifies the value contained in the corresponding register. When instructions are issued out of order and complete out of order, the correspondence between registers and values breaks down, and values conflict for registers. This problem is severe when the goal of register allocation is to keep as many values in as few registers as possible. Keeping a large number of values in a small number of registers creates a large number of conflicts when the execution order is changed from the order assumed by the register allocator.

Anti- and output dependencies are more properly called "storage conflicts" because the reuse of storage locations (including registers) causes instructions to interfere with one another even though the conflicting instructions are otherwise independent. Storage conflicts constrain instruction issue and reduce performance.

In view of the above discussion it becomes clear that implementing data dependency circuits, and register renaming circuits in general, is complex and requires a great deal of semiconductor area. Superscalar RISC processors in particular, strive to simultaneously execute multiple instructions. As this technology develops, chip developers attempt to simultaneously execute more and more instructions. Thus, the required amount of dependency checking increases at an exponential rate.

What is needed is an integrated structure layout (also called a floorplan) of components and interconnections that can efficiently integrate sections of the register renaming circuit (RRC) to conserve semiconductor chip area.

A more detailed description of some of the basic concepts discussed in this application is found in a number of references, including Mike Johnson, *Superscalar Microprocessor Design* (Prentice-Hall, Inc., Englewood Cliffs, N.J., 1991); John L. Hennessy et al., *Computer Architecture—A Quantitative Approach* (Morgan Kaufmann Publishers, Inc., San Mateo, Calif., 1990). Johnson's text, particularly Chapters 2, 6 and 7 provide an excellent discussion of the register renaming and data dependency issues addressed by the present invention.

SUMMARY OF THE INVENTION

The present invention is directed to an arrangement of components fabricated on a microprocessor integrated chip with significant design emphasis on the topological arrangement of a Data Dependency Checker (DDC) circuit and a Tag Assignment Logic (TAL) of a Register Renaming Circuit (RRC) circuit and their interconnections to conserve semiconductor real estate.

A basic RRC structure comprises rows and columns of DDC blocks interleaved with TAL blocks laid-out to form a right-angled triangle. The arrangement of the present invention is achieved by flipping several columns of a basic RRC structure so as to open an center channel in the RRC to permit easy routing of TAL outputs.

The layout arrangement of the present invention for the DDC and TAL reduces the distance signals must travel between the DDC and TAL, as well the distance the TAL output signals must travel to reach a set of register port multiplexers (RPM). The specially arranged rows and columns and associated interconnects permits a considerable amount of chip area to be conserved, thus permitting register renaming for many instructions in parallel.

BRIEF DESCRIPTION OF THE DRAWINGS/FIGURES

The invention will be better understood if reference is made to the accompanying drawings in which:

FIG. 1 shows a representative high level block diagram of a register renaming circuit (RRC).

FIG. 2 is a representative floorplan showing a simple layout of an RRC.

FIG. 3 is a representative floorplan showing an improved layout of an RRC in accordance with the present invention.

FIG. 4 is a representative floorplan showing a further improved layout of an RRC in accordance with the present invention.

DETAILED DESCRIPTION OF THE INVENTION

FIG. 1 shows a representative high level block diagram of an Instruction Execution Unit (IEU) 100 associated with the present invention. The goal of IEU 100 is to execute as many instructions as possible in the shortest amount of time. There are two basic ways to accomplish this: optimize IEU 100 so that each instruction takes as little time as possible or optimize IEU 100 so that it can execute several instructions at the same time.

An IEU for use with the present invention is disclosed in commonly owned, patents titled, "High Performance RISC Microprocessor Architecture". U.S. Pat. No. 5,539,911, and "Extensible RISC Microprocessor Architecture", U.S. Pat. No. 5,560,032, the disclosures of which are incorporated herein by reference.

Instructions are sent to IEU 100 from an Instruction Fetch Unit (IFU, not shown) through an instruction FIFO (first-in-first-out register stack storage device) 101 in groups of four called "buckets." IEU 100 can decode and schedule up to two buckets of instructions at one time. FIFO 101 stores 16 total instructions in four buckets labeled 0-3. IEU 100 looks at an instruction window 102. In one embodiment of the present invention, window 102 comprises eight instructions (buckets 0 and 1). Every cycle IEU 100 tries to issue a maximum number of instructions from window 102. Window 102 functions as a instruction buffer register. Once the instructions in a bucket are executed and their results stored in the processor's register file (see block 117), the bucket is flushed out a bottom 104 and a new bucket is dropped in at a top 106.

In order to execute instructions in parallel or out of order, care must be taken so that the data that each instruction needs is available when the instruction needs it and also so that the result of each instruction is available for any future instructions that might need it. A Register Rename Circuit (RRC), which is part of the scheduling logic of the computer's IEU performs this function by locating dependencies between current instructions and then renaming the sources (inputs) of the instruction.

As noted above, there are three types of dependencies: input dependencies, output dependencies and anti-dependencies. Input dependencies occur when an instruction, call it A, that performs an operation on the result of a previous instruction, call it B. Output dependencies occur when the outputs of A and B are to be stored in the same place. Anti-dependencies occur when instruction A comes before B in the instruction stream and B's result will be stored in the same place as one of A's inputs.

Input dependencies are handled by not executing instructions until their inputs are available. RRC 112 is used to locate the input dependencies between current instructions and then to signal an Instruction Scheduleror Issuer 118 when all inputs for a particular instruction are ready. In order to locate these dependencies, RRC 112 compares the register file addresses of each instruction's inputs with the addresses of each previous instruction's output using a data dependency circuit (DDC) 108. If one instruction's input comes from a register where a previous instruction's output will be stored, then the latter instruction must wait for the former to finish.

This implementation of RRC 112 can check eight instructions at the same time, so a current instruction is defined as any one of those eight from window 102. It should become evident to those skilled in the art that the present invention can easily be adapted to check more or less instructions.

In one embodiment of the present invention, instructions can have from 0 to 3 inputs and 0 or 1 outputs. Most instructions' inputs and outputs come from, or are stored in, one of several register files. Each register file 117 (e.g., separate integer, floating and boolean register files) has 32 real entries plus the group of 8 temporary buffers 116. When an instruction completes (the term "complete" means that the operation is complete and the operand is ready to be written to its destination register), its result is stored in its preassigned location in the temporary buffers 116. Its result is later moved to the appropriate place in register file 117 after all previous instructions' results have been moved to their places in the register file. This movement of results from temporary buffers 116 to register file 117 is called "retirement" and is controlled by termination logic, as should become evident to those skilled in the art. More than one instruction may be retired at a time. Retirement comprises updating the "official state" of the machine including the computer's Program Counter, as will become evident to those skilled in the art. For example, if instruction I0 happens to complete directly before instruction I1, both results can be stored directly into register file 117. But if instruction I3 then completes, its result must be stored in temporary buffer 116 until instruction I2 completes. By having IEU 100 store each instruction's result in its preassigned place in the temporary buffers 116. IEU 100 can execute instructions out of program order and still avoid the problems caused by output and anti-dependencies.

RRC 112 sends a bit map to an Issuer 118 via a bus 120 indicating which instructions in window 102 are ready for issuing. Instruction decode logic (not shown) indicates to Issuer 118 the resource requirements for each instruction over a bus 123. For each resource in IEU 100 (e.g., each functional unit being an adder, multiplier, shifter, or the like), Issuer 118 scans this information and selects the first and subsequent instructions for issuing by sending issue signals over bus 121. The issue signals select a group of Register File Port MUXes (RPMs) 124 inside RRC 112 whose inputs are the addresses of each instruction's inputs.

Because the results may stay in temporary buffer 116 several cycles before going to register file 117, a mechanism is provided to get results from temporary buffer 116 before they go to register file 117, so the information can be used as operands for other instructions. This mechanism is called "result forwarding," and without it, Issuer 118 would not be able to issue instructions out of order. This result forwarding is done in register file 117 and is controlled by RRC 112. The control signals necessary for performing the result forwarding will be evident to those skilled in the art, as should the random logic used for generating such control signals.

If an instruction is not dependent on any of the current instructions result forwarding is not necessary since the instruction's inputs are already in register file 117. When Issuer 118 decides to execute that instruction, RRC 112 tells register file 117 to output its data.

RRC 112 contains three subsections: a Data Dependency Checker (DDC) 108, Tag Assign Logic (TAL) 122 and Register File Port MUXes (RPM) 124. DDC 108 determines where the input dependencies are between the current instructions. TAL 122 monitors the dependencies for Issuer 118 and controls result forwarding. RPM 124 is controlled by Issuer 118 and directs the outputs of TAL 122 to the appropriate register file address ports 119. Instructions are passed to DDC 108 via bus 110. All source registers are compared with all previous destination registers for each instruction in window 102.

Each instruction has only one destination, which may be a double register in one embodiment. An instruction can only depend on a previous instruction and may have up to three source registers. There are various register file source and destination addresses that need to be checked against each other for any dependencies. As noted above, the eight bottom instructions corresponding to the lower two buckets are checked by DDC 108. All source register addresses are compared with all previous destination register addresses for the instructions in window 102.

For example, let's say a program has the following instruction sequence:

add R0, R1, R2(0)
add R0, R2, R3(1)
add R4, R5, R2(2)
add R2, R3, R4(3)

The first two registers in each instruction 0-3 are the source registers, and the last listed register in each instruction is the destination register. For example, R0 and R1 are the source registers for instruction 0 and R2 is the destination register. Instruction 0 adds the contents of registers 0 and 1 and stores the result in R2. For instructions 1-3 in this example, the following are the comparisons needed to evaluate all of the dependencies:

I1S1, I1S2 vs. I0D,
I2S1, I2S2 vs. I1D,I0D,
I3S1, I3S2 vs. I2D,I1D, I0D.

The key to the above is as follows: IXRS1 is the address of source (input) number 1 of instruction X; IXRS2 is the address of source (input) number 2 of instruction X; and IXD is the address of the destination (output) of instruction X.

Note also that RRC 112 can ignore the fact that instruction 2 is output dependent on instruction 0, because the processor has a temporary buffer where instruction 2's result can be stored without interfering with instruction 0's result. As discussed before, instruction 2's result will not be moved from temporary buffers 116 to register file 117 until instructions 0 and 1's results are moved to register file 117.

The number of instructions that can be checked by RRC 112 is easily scalable. In order to check eight instructions at a time instead of four, the following additional comparisons would also need to be made:

I4S1, I4S2 vs. I3D, I2D, I1D, I0D,
I5S1, I5S2 vs. I4D, I3D, I2D, I1D, I0D,
I6S1, I6S2 vs. I5D, I4D, I3D, I2D, I1D, I0D,
I7S1, I7S2 vs. I6D, I5D, I4D, I3D, I2D, I1D, I0D.

There are several special cases that RRC 112 must handle in order to do the dependency check. First, there are some instructions that use the same register as an input and an output. Thus, RRC 112 must compare this source/destination register address with the destination register addresses of all previous instructions. So for instruction 7, the following comparisons would be necessary:

I7S1,I7S2,I7S/D vs. I6D,I5D,I4D,I3D,I2D,I1D,I0D.

Another special case occurs when a program contains instructions that generate 64 bit outputs (called long-word operations). These instructions need two registers in which to store their results. In this embodiment, these registers must be sequential. Thus if RRC 112 is checking instruction 4's dependencies and instruction 1 is a long-word operation then it must do the following comparisons:

I4S1,I4S2 vs. I3D,I2D,I1D,I1D+1,I0D.

Sometimes, instructions do not have destination registers. Thus RRC 112 must ignore any dependencies between instructions without destination registers and any future instructions. Also, instructions may not have only one valid source register, so RRC 112 must ignore any dependencies between the unused source register (usually S2) and any previous instructions.

RRC 112 is also capable of dealing with multiple register files. When using multiple register files, dependencies only occur when one instruction's source register has the same address and is in the same register file as some other instruction's destination register. RRC 112 treats the information regarding which register file a particular address is from as part of the address. For example, in an implementation using four 32 bit register files, RRC 112 would do 7 bit compares stead of 5 bit compares (5 for the address and 2 for the register file).

Signals indicating which instructions are long-word operations or have invalid source or destination registers are sent to RRC 112 from Instruction Decode Logic (IDL; not shown).

A straight forward, representative floorplan for laying out DCL 108, TAL 122 and RPM 124 for RRC 112 is shown in FIG. 2. DDC 108 has two sets of inputs. The first set includes source address signals from FIFO 101 for all eight instructions of window 102; these inputs are shown at reference number 202. Inputs 202 are also supplied to TAL blocks 220, as shown by reference number 222. The second set of inputs includes long-word load operation flags, register file decode signals, invalid destination register flags, destination address signals and addressing mode flags for all eight instructions; these inputs are shown at reference number 203.

DDC 108 comprises 28 data dependency blocks 204. Each block 204 eceives 3 inputs, IXS1, IXS2 and IXS/D. IXS1 is the address of source (input) number 1 of instruction X, IXS2 is the address of source (input) number 2 of instruction X; and IXS/D is the address of the source/destination (input) of instruction X. Each block 204 also receives input IYS/D, which is the destination register address for instruction Y. A first column 208, for example, receives I0S/D, which is the destination register address for instruction 0. Each block 204 outputs the data dependency results to one of a corresponding bus line 214 to a TAL block 220. In this example, the address of I2S/D must be checked with operand addresses S1, S2 and S/D of instructions 7, 6, 5, 4, and 3.

Each tag assignment logic block 220 receives the corresponding data dependency results via buses 214, as well as further signals that come from the computer's IDL (not shown) via a set of input lines 226. A BKT bit forms the least significant bit of the tag. A set of DONE[X] flags for instructions 0 through 6 indicate if the instruction is done. A set of DBLREG[X] flags indicates which, if any, of the instructions is a double (long) word.

Each TAL block 220 also receives its own instruction's register addresses as inputs; this input is indicated by reference number 222. The miscellaneous signals DBLREG and BKT signals are all implementation dependent control signals. Each TAL block 220 outputs 0-3 TAGs 126 labeled IXS1, IXS2 and IXS/D, which are 6 bits. TALs 220 also outputs the least significant 5 bits of each TAG signal to RPMs 124 via output buses 224 which form a main bus 126, and the most significant TAG bit to ISL 218 via bus 120.

The floorplan arrangement shown in FIG. 2 has two major limitations: it requires a large area, and some of the outputs 214 of DDC 108 have to travel a long distance to TAL 122, which limits the performance of RRC 112.

A second floorplan embodiment is shown at FIG. 3. In this arrangement, TAL blocks 220 are placed (e.g., integrated with) between compare blocks 204 of DDC 108, as shown generally at reference number 302. This arrangement does, however, have one limitation. The most efficient arrangement of DDC 108 and TAL 122 requires that TAL 122 outputs 224 exit near the middle of rows 4, 5, 6 and 7, which is shown at a dashed box 304. This creates a wiring problem, because TAL 122 outputs 224 now must travel a long distance to RPM 124, especially in the case of 17.

To resolve this problem, the TAL outputs of the rows furthest away from RPM 124 must be channeled through the rows closest to RPM 124. One method would be to expand rows 4, 5 and 6 enough to get all of the wires through. Since compare blocks 204 must be lined up vertically, row 7 would also need to be expanded. This would increase the width of RRC 112.

A preferred floorplan embodiment of the present invention is shown in FIG. 4. In the floorplan layout shown in FIG. 4, the left sides of rows 4, 5, 6, and 7 have been flipped. In other words, referring to the vertically aligned comparators 204 and their associated TAL logic as columns, columns 3, 4, 5 and 6 have been flipped. This creates gap in rows 4, 5 and 6 without increasing the length of row 7. (The gap is also called a center channel and is shown as a dashed box 402.) TAL outputs 224 of rows 4-7 are laid-out in center channel 402 and are fed directly to RPM 124 in essentially a straight path. The overall area of RRC 112 therefore remains the same.

While various embodiments of the present invention have been described above, it should be understood that they have been presented by way of example, and not limitation. Thus the breadth and scope of the present invention should not be limited by any of the above-described exemplary embodiments, but should be defined only in accordance with the following claims and their equivalents.

What is claimed is:

1. An integrated structure layout for an instruction execution unit of an integrated circuit chip, comprising:
    a row of data dependency comparator blocks, wherein each data dependency comparator block is configured to compare at least one source operand address of a first instruction to a destination operand address of a second instruction and to output data dependency information; and
    a tag assignment logic block coupled to the data dependency comparator blocks to receive the data dependency information, wherein the tag assignment block is positioned approximately at the center of the row of data dependency comparator blocks to conserve area on the integrated circuit chip, and wherein the tag assignment logic block outputs tag information identifying an address in a register file responsive to receiving the data dependency information.

2. The integrated structure layout of claim 1, wherein each data dependency comparator block receives at least one source operand address of an instruction in a group of multiple instructions.

3. The integrated structure layout of claim 2, wherein each data dependency comparator block receives a destination operand address of the instruction in a group of multiple instructions.

4. The integrated structure layout of claim 1, wherein each data dependency comparator block is configured to compare at least one source operand address of a first instruction to a destination operand address of a second instruction.

5. The integrated structure layout of claim 4, wherein the second instruction precedes the first instruction in a predefined program order.

6. The integrated structure layout of claim 1, wherein each data dependency comparator block is configured to compare two source operand addresses of a first instruction to a destination operand address of a second instruction.

7. The integrated structure layout of claim 1, wherein the tag assignment logic block receives at least one source operand address and a destination operand address.

8. The integrated structure layout of claim 1, further comprising:
    a register file port multiplexer coupled to the tag assignment logic block to receive the tag information and to pass the tag information to address ports of the register file.

9. The integrated structure layout of claim 8, wherein the data dependency comparator blocks, the tag assignment logic block and the register file port multiplexer comprise a register renaming circuit that permits out-of-order issuance of multiple instructions.

* * * * *